(12) United States Patent
Faheem et al.

(10) Patent No.: US 7,781,852 B1
(45) Date of Patent: Aug. 24, 2010

(54) MEMBRANE DIE ATTACH CIRCUIT ELEMENT PACKAGE AND METHOD THEREFOR

(75) Inventors: Faheem F. Faheem, Chandler, AZ (US); Christopher M. Scanlan, Chandler, AZ (US); Christopher J. Berry, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 666 days.

(21) Appl. No.: 11/566,731

(22) Filed: Dec. 5, 2006

(51) Int. Cl.
*G01L 9/04* (2006.01)

(52) U.S. Cl. .............. 257/419; 257/E23.062; 257/434; 257/680

(58) Field of Classification Search .......... 257/E23.062, 257/100, 433, 434, 676, 680, 666, 778, 419; 250/208.1, 239
See application file for complete search history.

(56) References Cited

U.S. PATENT DOCUMENTS

| RE35,069 E | * | 10/1995 | Hallenbeck et al. | ......... 250/216 |
|---|---|---|---|---|
| 5,852,320 A | * | 12/1998 | Ichihashi | ................... 257/419 |
| 5,859,759 A | * | 1/1999 | Moriyama et al. | ....... 361/283.4 |
| 6,100,595 A | * | 8/2000 | Jaouen et al. | ................ 257/778 |
| 6,181,015 B1 | * | 1/2001 | Gotoh et al. | ................. 257/778 |
| 6,396,116 B1 | * | 5/2002 | Kelly et al. | .................... 257/432 |
| 6,441,503 B1 | * | 8/2002 | Webster | ...................... 257/787 |
| 6,519,161 B1 | * | 2/2003 | Green | ......................... 174/394 |
| 6,765,236 B2 | * | 7/2004 | Sakurai | ....................... 257/98 |
| 6,982,491 B1 | * | 1/2006 | Fan et al. | ..................... 257/778 |
| 7,015,579 B2 | * | 3/2006 | Okada et al. | ................ 257/738 |
| 7,176,541 B2 | * | 2/2007 | Tanaka et al. | ............... 257/419 |
| 7,202,552 B2 | * | 4/2007 | Zhe et al. | .................... 257/659 |
| 7,294,827 B2 | * | 11/2007 | Tan et al. | .................... 250/239 |
| 7,304,362 B2 | * | 12/2007 | Zhou et al. | .................. 257/433 |
| 7,405,456 B2 | * | 7/2008 | Chen et al. | ................... 257/434 |
| 7,495,325 B2 | * | 2/2009 | Abela | ......................... 257/680 |
| 2005/0026313 A1 | * | 2/2005 | Barzen et al. | ................. 438/15 |
| 2007/0013052 A1 | * | 1/2007 | Zhe et al. | .................... 257/704 |

* cited by examiner

*Primary Examiner*—Chris Chu
(74) *Attorney, Agent, or Firm*—Weiss & Moy, P.C.

(57) ABSTRACT

A circuit element package has a substrate having a plurality of electrically conductive patterns, a die pad, and an access hole formed through the die pad and substrate. A plurality of leads is coupled to the substrate. A circuit element die is attached to the die pad wherein a first sensor port is positioned over the access hole. A die attach membrane is provided for attaching the circuit element die to the die pad. The die attach membrane allows the circuit element die to sense ambient while protecting the circuit element die from environmental damage. An encapsulant is used for covering portions of the circuit element die.

20 Claims, 9 Drawing Sheets

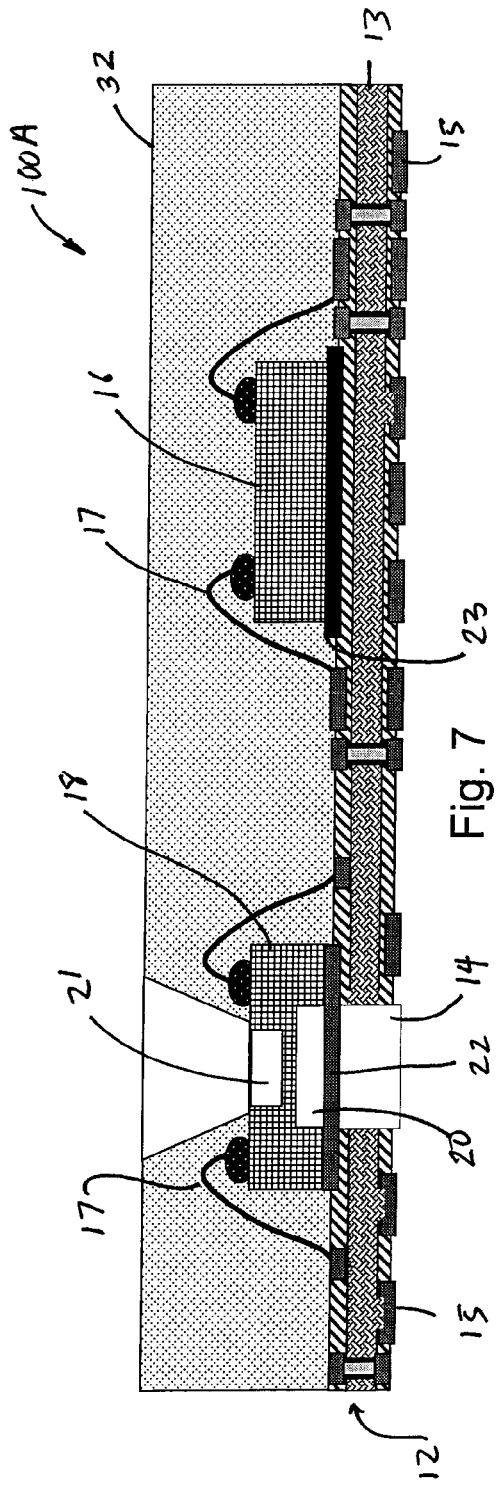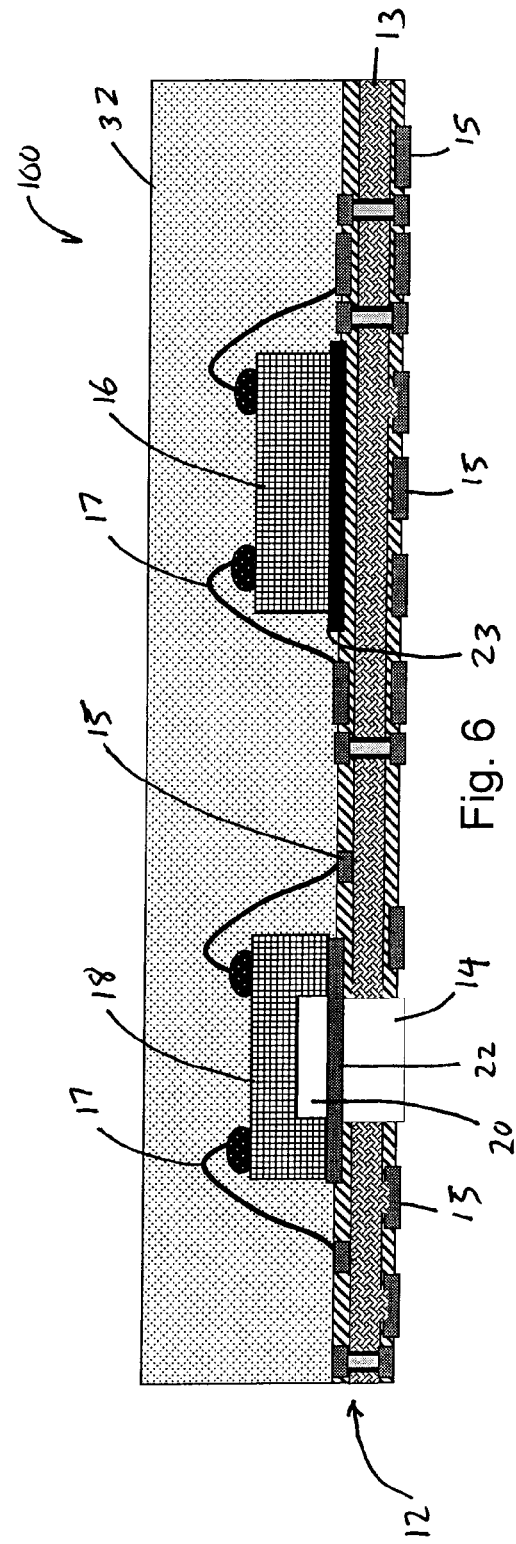

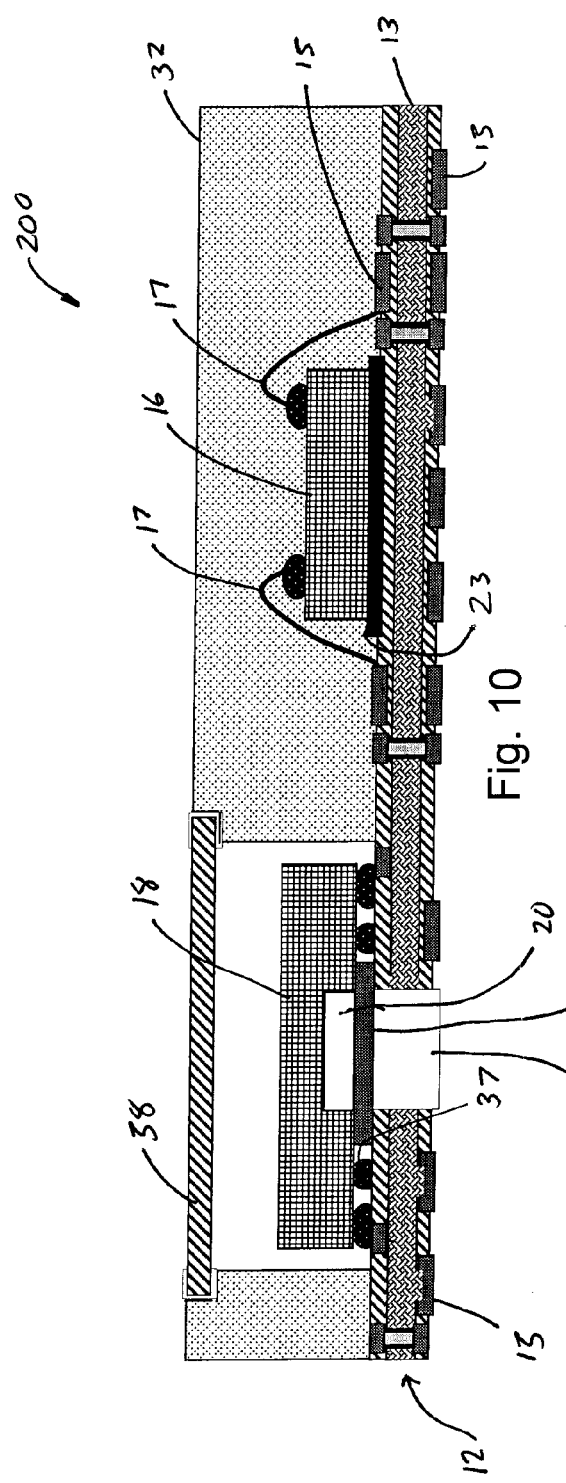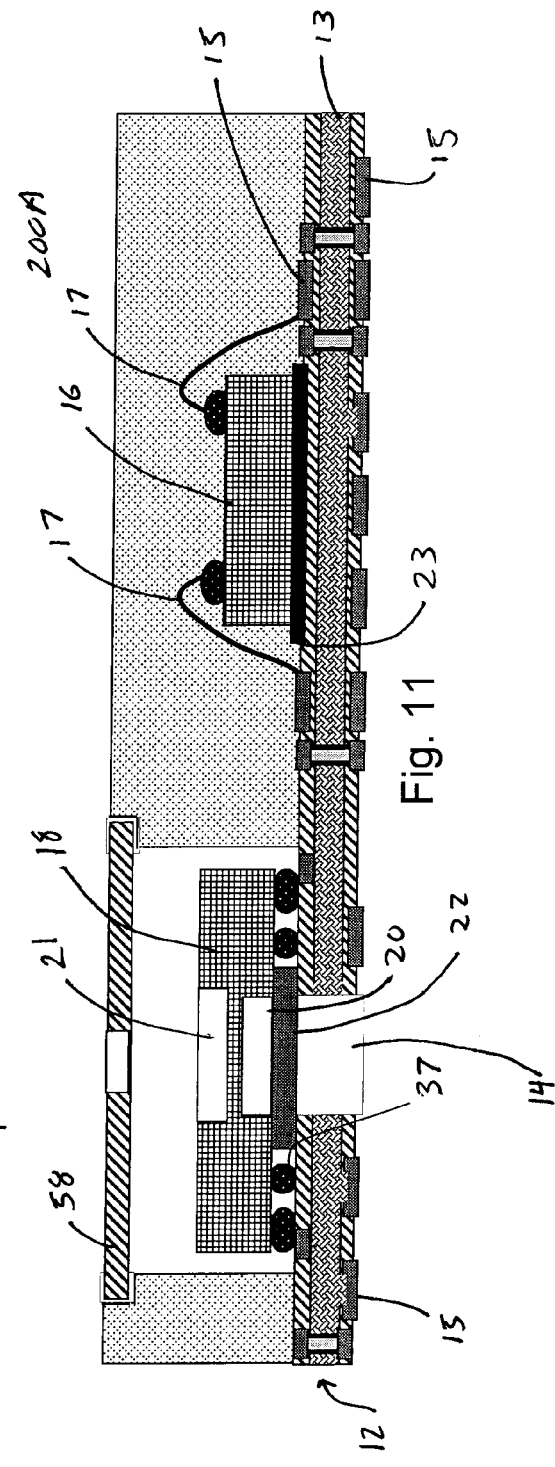

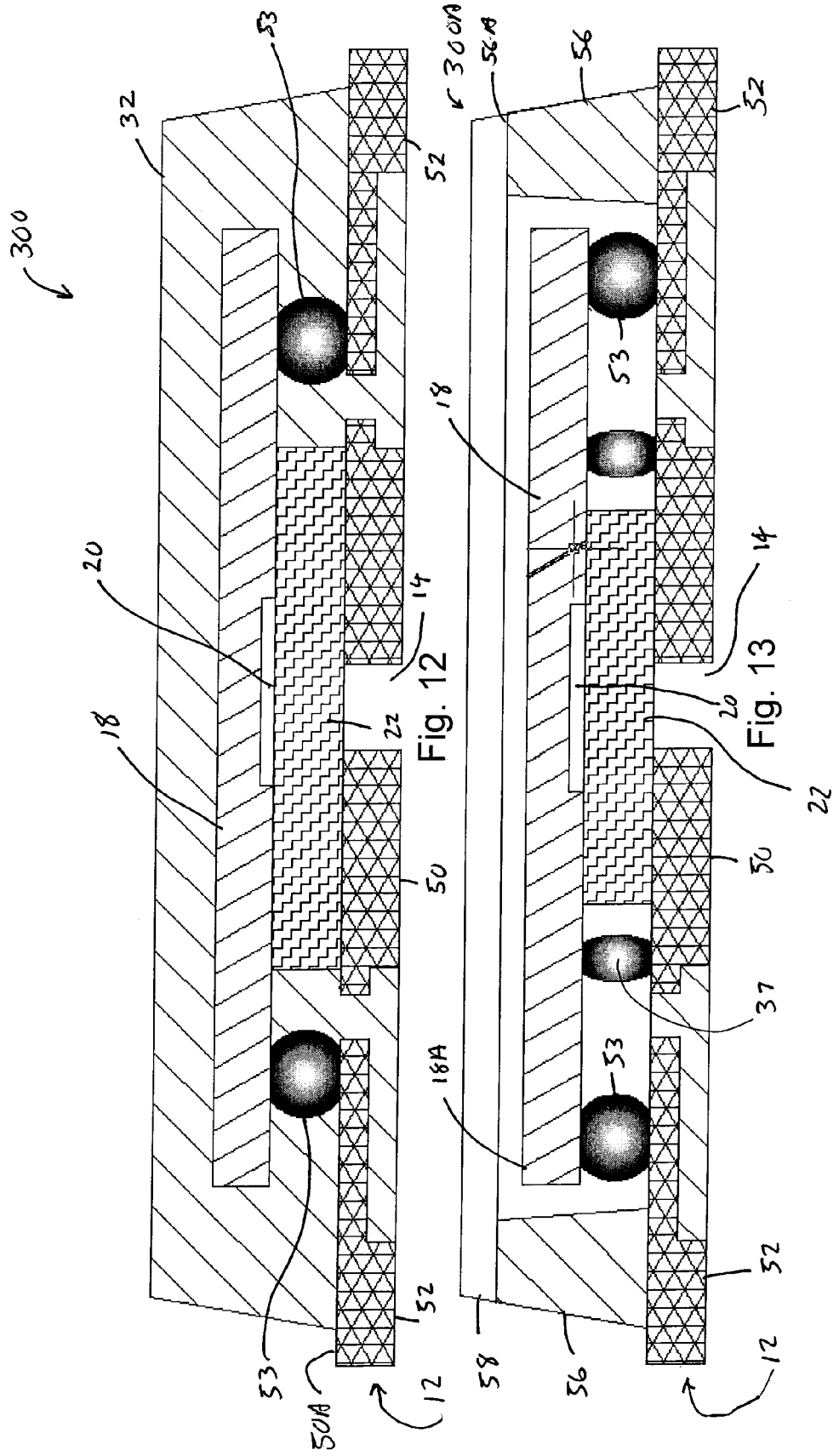

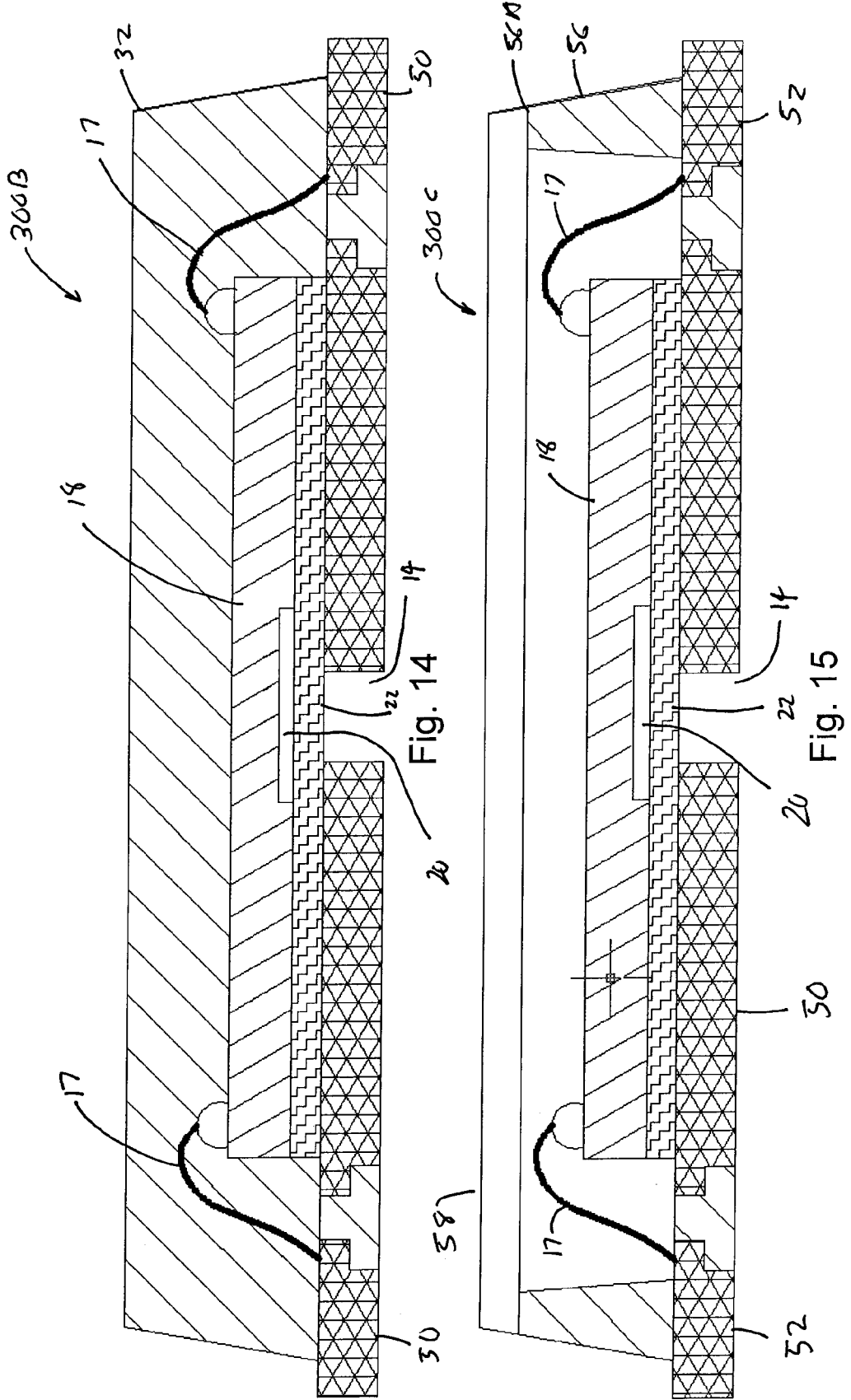

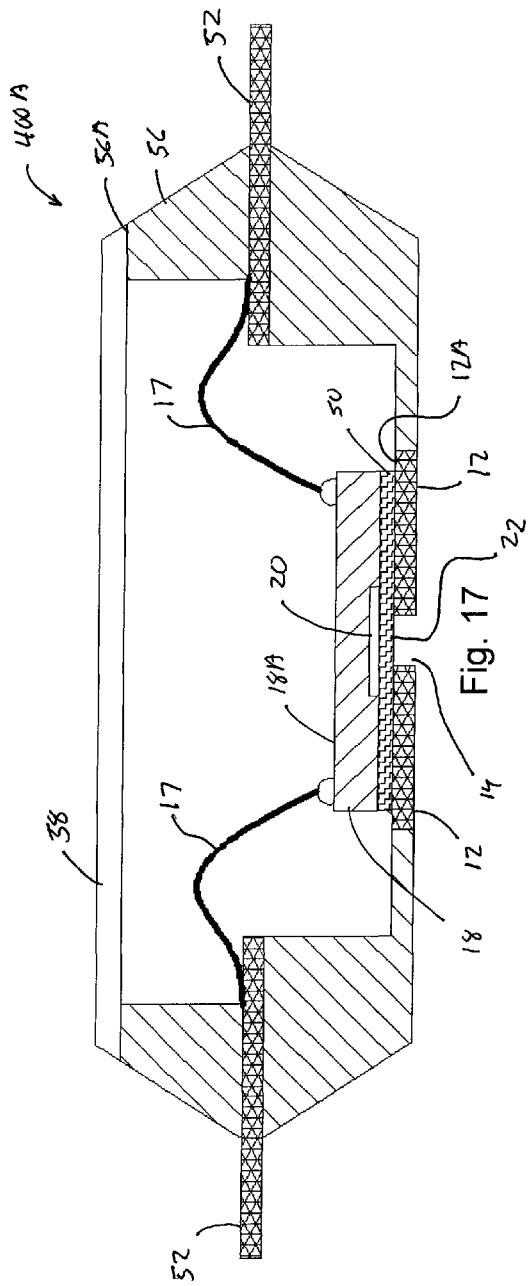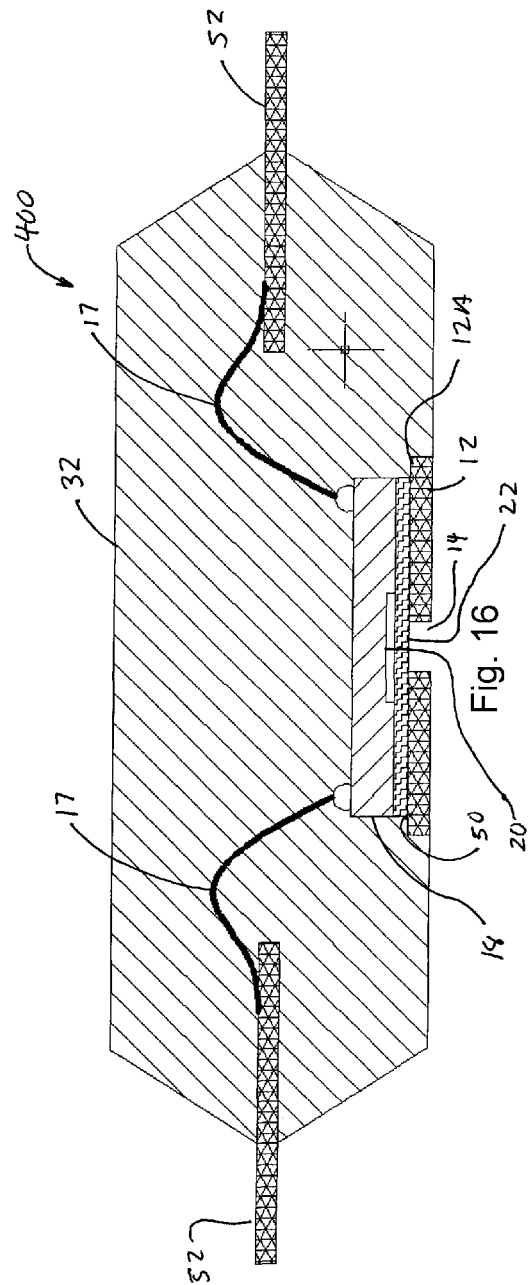

MEMBRANE DIE ATTACH CIRCUIT ELEMENT PACKAGE AND METHOD THEREFOR

FIELD OF THE INVENTION

This invention relates to a circuit element package and, more specifically, to a circuit element package having a membrane element which enables a circuit element die to be exposed to the ambient the circuit element die is to measure, while also protecting the circuit element die from destructive environmental agents.

BACKGROUND OF THE INVENTION

Sensor applications are expanding rapidly. This is especially true in the Micro-Electro-Mechanical System (MEMS) field. The MEMS field is the integration of mechanical elements, sensors, actuators, or the like and electronics on a common silicon substrate through microfabrication technology.

Presently, the packaging of pressure sensors typically includes isolating the sensing element from the ambient environment. However, by isolating the sensing element from the ambient environment, a certain degree of accuracy is lost. Furthermore, in some pressure sensors, the material used to hold the sensing elements may not be resistant to the operating environment. This may cause the pressure sensor to fail in a corrosive environment.

Therefore, a need exists to provide a device and method to overcome the above problem. The device and method should provide a package construction that mounts the circuit element die inside an electronic package in the conventional sense but which also allows a sensing element in the active device to be exposed to the environment it is intended to monitor.

SUMMARY OF THE INVENTION

A circuit element package has a substrate having a plurality of electrically conductive patterns, a die pad, and an access hole formed through the die pad and substrate. A plurality of leads is coupled to the substrate. A circuit element die is attached to the die pad wherein a first sensor port is positioned over the access hole. A die attach membrane is provided for attaching the circuit element die to the die pad. The die attach membrane allows the circuit element die to sense ambient while protecting the circuit element die from environmental damage. An encapsulant is used for covering portions of the circuit element die.

The present invention is best understood by reference to the following detailed description when read in conjunction with the accompanying drawings.

BRIEF DESCRIPTION OF THE DRAWINGS

FIG. 6 is an LGA embodiment of the present invention;

FIG. 7 is another LGA embodiment of the present invention;

FIG. 10 is another embodiment of the present invention using flip chip interconnects;

FIG. 11 is another embodiment of the present invention using flip chip interconnects;

FIG. 12 is a quad or dual flat no lead (QFN/DFN) embodiment of the present invention using flip chip interconnects;

FIG. 13 is another quad or dual flat no lead (QFN/DFN) embodiment of the present invention using flip chip interconnects;

FIG. 14 is a quad or dual flat no lead (QFN/DFN) embodiment of the present invention;

FIG. 15 is another quad or dual flat no lead (QFN/DFN) embodiment of the present invention;

FIG. 16 is a small outline (SO) embodiment of the present invention; and

FIG. 17 is another small outline (SO) embodiment of the present invention.

Common reference numerals are used throughout the drawings and detailed description to indicate like elements.

DETAILED DESCRIPTION

Figure 1:
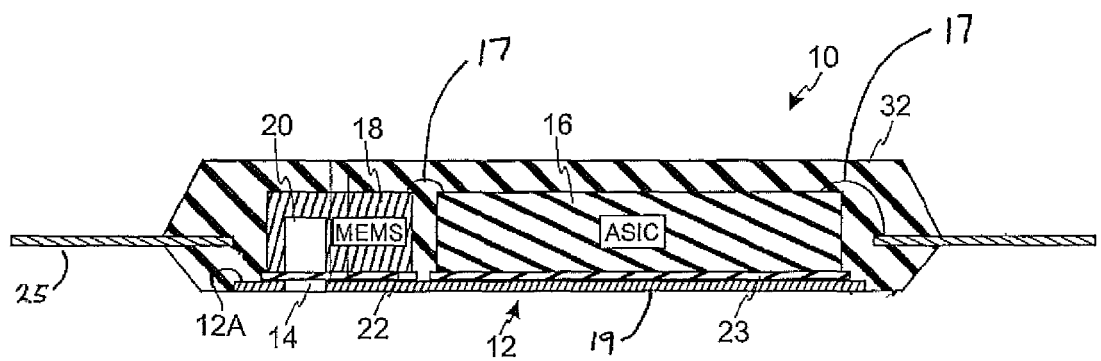
FIG. 1 is a cross-sectional side view of one embodiment of the circuit element package of the present invention.

Referring to FIG. 1, a cross-sectional view of a circuit element package 10 is shown. In the embodiment of FIG. 1, the circuit element package 10 is a leadframe type of package. However, this should not be seen as to limit the scope of the present invention. The semiconductor device 10 may be a leaded type of device, a Ball Grid Array (BGA) type of device, a Land Grid Array (LGA) type of device, or the like.

The circuit element package 10 has a substrate 12. The substrate 12 is generally made of a metal material. Examples of the metal material include, but are not limited to: copper, copper alloy, plated copper, plated copper alloy, Alloy 37, steel plated with copper, and the like. The substrate 12 comprises a die pad 19 and a plurality of leads 25 positioned around the die pad 19. A die pad 19 is formed on the first surface 12A of the substrate 12. An access hole 14 is formed through the die pad 19 of the substrate 12.

A semiconductor die 16 and a circuit element die 18 are coupled to a first surface 12A of the die pad 19. The semiconductor die 16 may be any type of device such as a memory device, a logic device, an ASIC device, and other like elements. In the Figures, the semiconductor die 16 is labeled as an ASIC device. However, this is given as an example and should not be seen as to limit the scope of the present invention. The circuit element die 18 may be a sensor, an actuator, or other types of devices typically referenced as MEMS die. In FIG. 1, the circuit element die 18 is a single sided sensor.

The semiconductor die 16 and the circuit element die 18 are placed on the die pad 19 of the substrate 12. The circuit element die 18 needs to be placed on the die pad 19 so that a sensor port 20 of the circuit element die 18 is positioned over the access hole 14. The semiconductor die 16 and the circuit element die 18 are attached to the die pad 19 using a die attach material 23 and a die attach membrane 22 respectively. The die attach material 23 is generally an adhesive film, epoxy, or the like. The listing of the above die attach material 23 is given as an example and should not be seen as to limit the scope of the present invention.

The die attach membrane 22 allows the sensor port 20 in the circuit element die 18 to be exposed to the ambient the circuit element die 18 is intended to monitor through the access hole 14. However, the circuit element die 18 is likely to be mechanically and chemically sensitive and therefore needs some form of protection from the environment. The die attach membrane 22 is designed to enable the circuit element die 18 to be exposed to the ambient that the circuit element die 18 is designed to measure, while simultaneously protecting the circuit element die 18 from environmental damage.

After the semiconductor die 16 and the circuit element die are attached to the die pad 19 of the substrate 12, the die 16 and the circuit element die 18 are electrically coupled the leads 25 of the substrate 12. The semiconductor die 16 the circuit element die 18 may be electrically coupled to the 25 of the substrate 12 through the use of wirebonds 17 as in FIG. 1. The semiconductor die 16 and the circuit element 18 may also be electrically coupled together. The semiconductor 16 and the circuit element die 18 may be electrically coupled through the use of wirebonds as shown in FIG. 1. A mold 32 is then used to encapsulate the semiconductor die 16 and the circuit element die 18.

Figure 2:
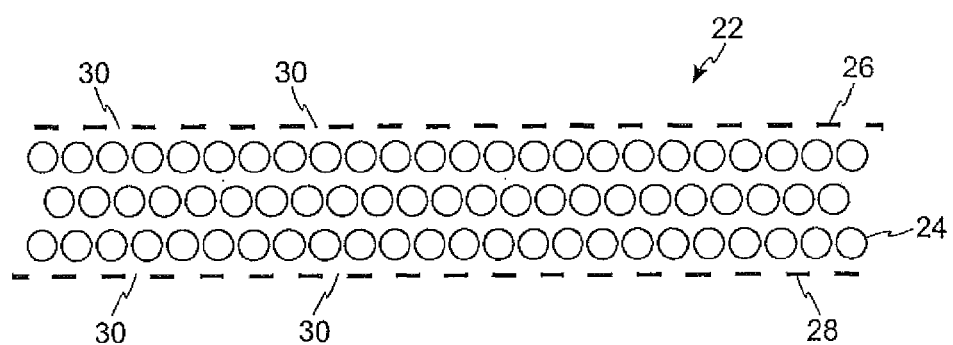
FIG. 2 is a view of the die attach membrane used in the circuit element package of the present invention.
Figure 3:
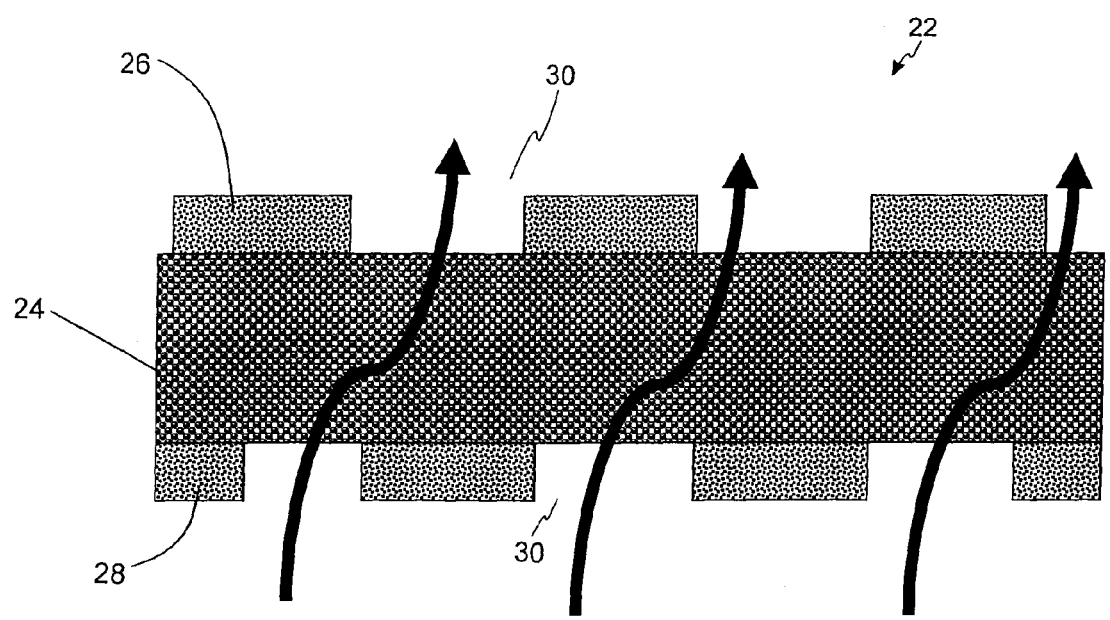
FIG. 3 is a magnified view of the die attach membrane used in the circuit element package of the present invention.

Referring to FIGS. 2 and 3, a magnified view of the die attach membrane 22 is shown. The die attach membrane 22 is used to couple the circuit element die 18 to the die pad 19 of the substrate 12. The die attach membrane 22 also enables the sensor port 20 to be exposed to the ambient the circuit element die 18 is designed to measure via the access hole 14, while simultaneously protecting the circuit element die 18 from environmental damage.

The die attach membrane 22 is comprised of a plurality of different layers. The die attach membrane 22 has a porous membrane layer 24. The porous membrane layer 24 has several hundred million micro pores per square centimeter. The porous membrane layer 24 allows the transmission of pressure signals into the sensor port 20 of the circuit element die 18, while retarding or eliminating the transmission of destructive environmental agents. The porous membrane layer 24 allows air, water vapor, and sound permeability, but is water proof, dust proof, and resistant to chemicals. In accordance with one embodiment of the present invention, the porous membrane layer 24 is made from Poly-Tetra-Fluoro-Ethylene commonly referred to as PTFE, or other similar material from this fluoroplastic family.

A first adhesive layer 26 is formed on a first surface of the porous membrane layer 24. The first adhesive layer 26 will allow the die attach membrane 22 to be coupled to the circuit element die 18. A second adhesive layer 28 is formed on a second surface of the porous membrane layer 24. The second adhesive layer 28 will allow the die attach membrane 22 to be coupled to the die pad 19. The first and second adhesive layers 26 and 28 are generally an adhesive film or the like.

Since the access hole 14 should not be blocked, the first and second adhesive layers 26 and 28 will have a plurality of openings 30 formed there through. The openings 30 formed in the first and second adhesive layers 26 and 28 will allow air to flow through the die attach membrane 22. However, the die attach membrane 22 will protect the circuit element die 18 from environmental damage. Any liquid which is allowed to penetrate the electronic package 10 will have a tendency to damage and crack the electronic package 10 under extreme temperature conditions. The openings 30 may be formed in any pattern that allows air to flow through the die attach membrane 22. The size of the openings 30 is generally based on the sensitivity of the circuit element die 18. The more sensitive the circuit element die 18, the larger the openings 30. In general, the size of the openings 30 is generally restricted by the machinery used to form the openings 30 in the adhesive layers 26 and 28. In accordance with one embodiment, the openings 30 may be formed as small as 30 microns. However, this is given as an example and should not be seen as to limit the scope of the present invention.

Figure 4:
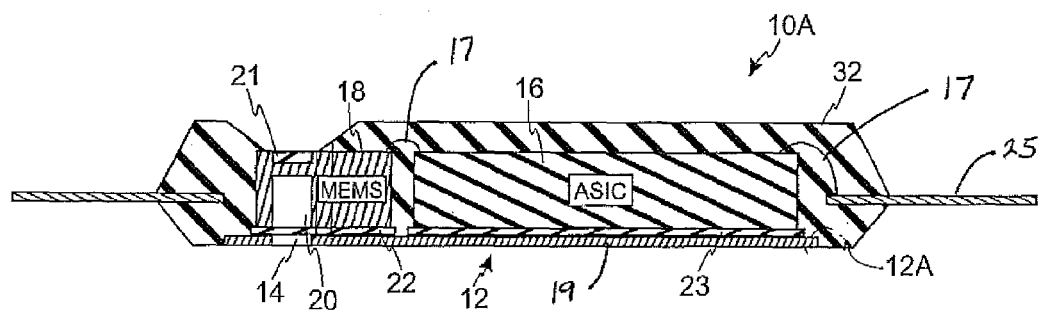
FIG. 4 is another embodiment of the present invention.

Referring now to FIG. 4, another embodiment of a circuit element package 10A is shown. The circuit element package 10A is similar to the circuit element package 10 shown in FIG. 1. In this embodiment, the circuit element die 18 is a doubled sided sensor. Thus, there are two sensor ports 20 and 21. The sensor port 21 is positioned on a surface of the circuit element die 18 opposite of the sensor port 20. During the encapsulation process, the mold compound 32 is not placed over the sensor port 21. Thus the sensor port 21 will be exposed.

Figure 5:
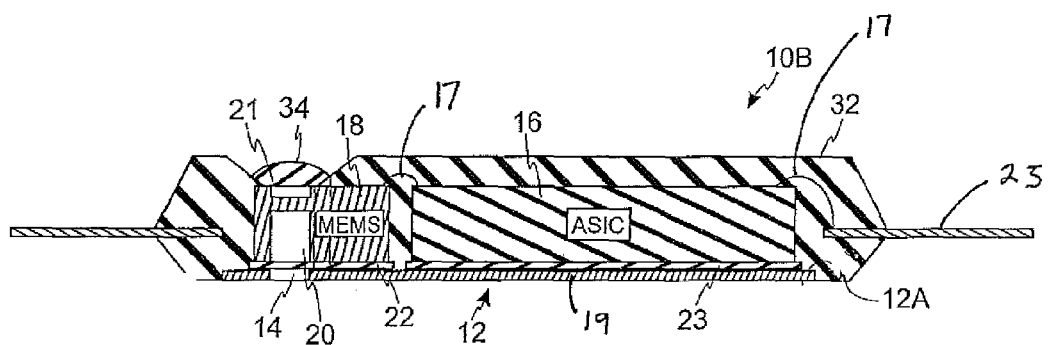
FIG. 5 is another embodiment of the present invention

Referring now to FIG. 5, another embodiment of a circuit element package 10B is shown. The circuit element package 10B is similar to the circuit element package 10A shown in FIG. 4. In this embodiment, a protective coating 34 is placed over the sensor port 21. The protective coating 34 is used to prevent damage to the circuit element die 18. The protective coating 34 may be a silicone based gel, Pyralene, or the like. The listing of the above is given as an example and should not be seen as to limit the scope of the present invention.

Referring now to FIG. 6, another embodiment of a circuit element package 100 is shown. The circuit element package 100 is similar to the circuit element package 10 shown in FIG. 1. In this embodiment, the circuit element package 100 is an LGA package having a laminate or tape based substrate 12. The substrate 12 will generally have a dielectric layer 13 and a plurality of metal patterns formed on the surface of the substrate 12. Metal lands 15 are formed on the top and bottom surfaces of the substrate 12. Wirebonds 17 are used to couple the semiconductor die 16 and the circuit element die 18 to the metal lands 15.

Referring now to FIG. 7, another embodiment of a circuit element package 100A is shown. The circuit element package 100A is similar to the circuit element package 10A shown in FIG. 4. The circuit element package 100A is an LGA package instead of a leadframe package having an exposed second sensor port 21. As in the embodiment depicted in FIG. 7, wirebonds 17 are used to couple the semiconductor die 16 and the circuit element die 18 to the substrate 12.

Figure 8:
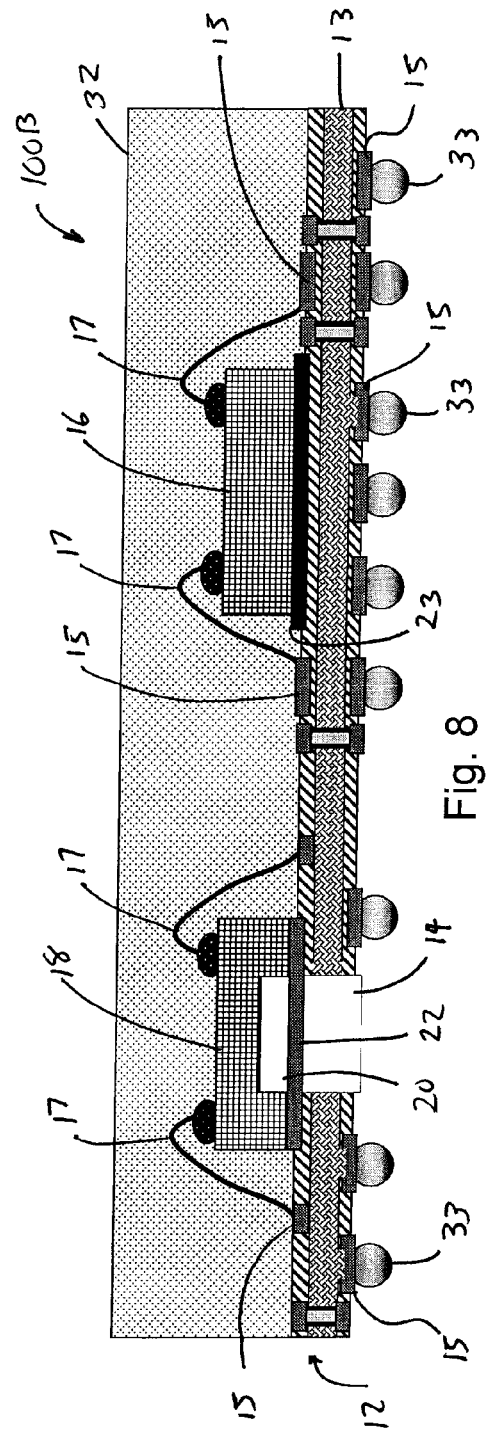
FIG. 8 is a BGA embodiment of the present invention.

Referring now to FIG. 8, another embodiment of a circuit element package 100B is shown. The circuit element package 100B is similar to the circuit element package 100 shown in FIG. 6. The circuit element package 100B is a BGA package. The circuit element package 100B has a substrate 12 having a dielectric layer 13 and a plurality of metal patterns formed on the surface of the substrate 12. Metal lands 15 are formed on the top and bottom surfaces of the substrate 12. Solder balls 33 are coupled to the metal lands 15. Wirebonds 17 are used to couple the semiconductor die 16 and the circuit element die 18 to the substrate 12.

Figure 9:
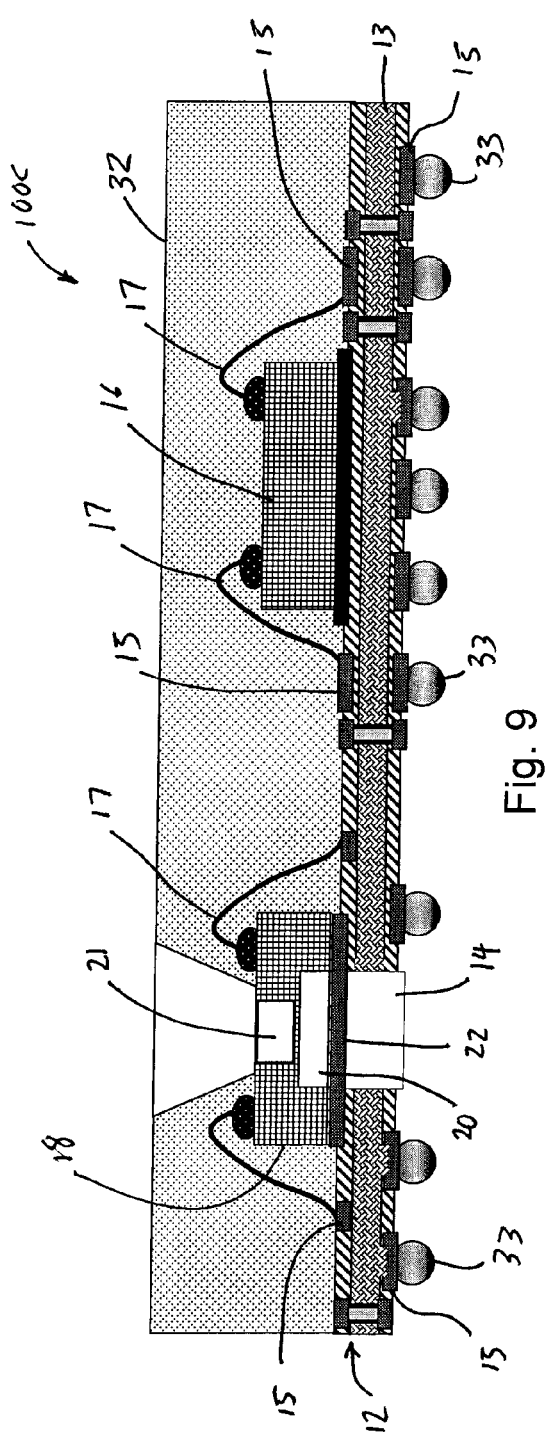
FIG. 9 is another BGA embodiment of the present invention.

Referring now to FIG. 9, another embodiment of the circuit element package 100C is shown. The circuit element package 100C is similar to the circuit element package 100A shown in FIG. 7. The circuit element package 100C is a BGA package having an exposed second sensor port 21. In the embodiment depicted in FIG. 9, wirebonds 17 are used to couple the semiconductor die 16 and the circuit element die 18 to the substrate 12.

Referring now to FIG. 10, another embodiment of the circuit element package 200 is shown. The circuit element package 200 is similar to the circuit element package 100 shown in FIG. 6. As shown in FIG. 10, flip chip interconnect is used. A cavity is formed in the mold compound 32 where the circuit element die 18 is attached to the substrate 12. A lid 58 is then attached to the top of the cavity. The lid 58 is used to protect the circuit element die 18 from environmental damage. The lid 58 may be plastic, metal or similar material. The lid 58 may further have one or more vents formed therein.

Solder dams 37 are formed on either the substrate 12 or the circuit element die 18. The solder dams 37 act as a barrier to positively isolate the pressure sensor port 20 of the circuit element die 18 from everywhere else on the electronic package 200.

Referring now to FIG. 11, another embodiment of the circuit element package 200A is shown. The circuit element package 200A is similar to the circuit element package 100A shown in FIG. 7. The main difference is that that flip chip interconnect is used. Furthermore, the entire circuit element package 200A is not encapsulated. A cavity is formed where the circuit element die 18 is attached to the substrate 12. A lid 58 is then coupled to the top of the cavity. The lid 58 is used to protect the circuit element die 18 from mechanical damage. The lid 58 may be plastic, metal or similar material. The lid 58 may further have one or more vents formed therein. Solder dams 37 are formed on either the substrate 12 or the circuit element die 18. The solder dams 37 act as a barrier to positively isolate the pressure sensor port 20 of the circuit element die 18 from everywhere else on the electronic package 200A.

Referring now to FIG. 12, another embodiment of a circuit element package 300 is shown. The circuit element package 300 uses a quad or dual flat no lead (QFN/DFN) substrate 12. The substrate 12 is generally made of a metal material. Examples of the metal material include, but is not limited to: copper, copper alloy, plated copper, plated copper alloy, Alloy 37, steel plated with copper, and the like. The substrate 12 comprises a die pad 50 and a plurality of leads 52 positioned around the die pad 19. The die pad 50 and leads 52 may also include half etched locking features that would improve the connection of die pad 50 and leads 52 to a mold compound 32 and prevent the die pad 50 and leads 52 from being vertically or horizontally from the mold compound 32. An access hole 14 is formed through the die pad 50. A single circuit element die 18 is placed on the first surface 50A of the die pad 50. The circuit element die 18 needs to be placed on the die pad 50 so that a sensor port 20 of the circuit element die 18 is positioned over the access hole 14 and the conductive bumps 53 are aligned and attached with a respective lead 52. The die attach membrane 22 is used to couple the circuit element die 18 to the first surface 50A of the die pad 50. The die attach membrane 22 also enables the sensor port 20 to be exposed via the access hole 14 to the ambient the circuit element die 18 is designed to measure, while simultaneously protecting the circuit element die 18 from environmental damage. The mold compound 32 is then used to encapsulate the circuit element die 18.

Referring now to FIG. 13, another embodiment of the circuit element package 300A is shown. The circuit element package 300A is similar to previous embodiment shown in FIG. 12 which use flip chip interconnects. Solder dams 37 are formed on either the die pad 50 or the circuit element die 18. The solder dams 37 act as a barrier to positively isolate the pressure sensor port 20 of the circuit element die 18 from everywhere else on the electronic package 300A. A molding process uses the mold compound 32 to encapsulate and form a cavity having sidewalls 56 around the circuit element die 18. The sidewalls 56 are formed so that a surface 56A of the sidewalls 56 is above a surface 18A of the circuit element die 18. After the molding process, the circuit element die 18 is attached to the die pad 50 so that the sensor port 20 of the circuit element die 18 is positioned over the access hole 14 and the conductive bumps 53 are aligned and attached with a respect lead 52. A lid 58 is then coupled to the surface 56A of the sidewalls 56. The lid 58 is used to protect the circuit element die 18 from environmental damage. The lid 58 may be plastic, metal or similar material. The lid 58 may further have one or more vents formed therein.

Referring now to FIG. 14, another embodiment of a circuit element package 300B is shown. The circuit element package 300B is similar to the previous embodiment shown in FIG. 12. The circuit element package 300B uses wirebonds 17 to electrically couple the circuit element die 18 to the leads 52.

Referring now to FIG. 15, another embodiment of a circuit element package 300C is shown. The circuit element package 300C is similar to previous embodiment shown in FIG. 13. The circuit element package 300C uses wirebonds 17 to electrically couple the circuit element die 18 to the leads 52.

Referring now to FIG. 16, another embodiment of a circuit element package 400 is shown. The circuit element package 400 is similar to the embodiment shown in FIG. 14 but is a small outline (SO) type package. The circuit element package 400 has a substrate 12. The substrate 12 is generally made of a metal material. Examples of the metal material include, but is not limited to: copper, copper alloy, plated copper, plated copper alloy, Alloy 37, steel plated with copper, and the like. The substrate 12 comprises a die pad 50 and a plurality of leads 52 positioned around the die pad 50. A circuit element die 18 is placed on the first surface 12A of substrate 12. The circuit element die 18 needs to be placed on the die pad 50 of the substrate 12 so that the sensor port 20 is positioned over the access hole 14. The die attach membrane 22 is used to couple the circuit element die 18 to the first surface 12A of the substrate 12. The die attach membrane 22 also enables the sensor port 20 to be exposed via the sensing hole 14 to the ambient the circuit element die 18 is designed to measure, while simultaneously protecting the circuit element die 18 from environmental damage. Wirebonds 17 are used to electrically couple the circuit element die 18 to the leads 52. The mold compound 32 is then used to encapsulate the circuit element die 18.

Referring now to FIG. 17, another embodiment of the circuit element package 400A is shown. The circuit element package 400A is similar to the embodiment shown in FIG. 15 but is a small outline (SO) type package. The circuit element package 400A has a substrate 12. The substrate 12 is generally made of a metal material. Examples of the metal material include, but is not limited to: copper, copper alloy, plated copper, plated copper alloy, Alloy 37, steel plated with copper, and the like. The substrate 12 comprises a die pad 50 and a plurality of leads 52 positioned around the die pad 50. An access hole 14 is formed through the substrate 12. A molding process uses the mold compound 32 to encapsulate and form a cavity having sidewalls 56 around the circuit element die 18. The sidewalls 56 are formed so that a surface 56A of the sidewalls 56 is above a surface 18A of the circuit element die 18. After the molding process, the circuit element die 18 is placed on the first surface 12A of substrate 12. The circuit element die 18 needs to be placed on the die pad 50 of the substrate 12 so that the sensor port 20 is positioned over the access hole 14. The die attach membrane 22 is used to couple the circuit element die 18 to the first surface 12A of the substrate 12. The die attach membrane 22 also enables the sensor port 20 to be exposed via the sensing hole 14 to the ambient the circuit element die 18 is designed to measure, while simultaneously protecting the circuit element die 18 from environmental damage. Wirebonds 17 are used to electrically couple the circuit element die 18 to the leads 52. A lid 58 is then coupled to the surface 56A of the sidewalls 56. The lid 58 is used to protect the single semiconductor die 54 from environmental damage. The lid 58 may be plastic, metal or similar material. The lid 58 may further have one or more vents formed therein.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A circuit element package comprising:
   a substrate having a die pad, and an access hole formed through the die pad and substrate;
   a circuit element die attached to the die pad and having a sensor port positioned over the access hole;
   a die attach membrane formed over the access hole for attaching the circuit element die to the die pad, the die attach membrane allowing the circuit element die to sense ambient while protecting the circuit element die from environmental damage, wherein the portion of the die attach membrane for attaching the circuit element to the die pad allows air to flow through the die attach membrane to the circuit element; and
   an encapsulant for covering portions of the circuit element die.

2. A circuit element package in accordance with claim 1 further comprising:
   a semiconductor die; and
   an adhesive layer for coupling the semiconductor die to the substrate.

3. A circuit element package in accordance with claim 1 wherein the die attach membrane comprises:
   a porous membrane layer;
   a first adhesive layer formed on a first surface of the porous membrane layer;
   a second adhesive layer formed on a second surface of the porous membrane layer; and
   a plurality of openings formed in the first and second adhesive layers for allowing air to flow through the die attach membrane.

4. A circuit element package in accordance with claim 3 wherein the porous membrane layer is made from Poly-Tetra-Fluoro-Ethylene (PTFE).

5. A circuit element package in accordance with claim 3 wherein the plurality of openings are arranged in the first and second adhesive layers to prevent direct access to the first sensing element.

6. A circuit element package in accordance with claim 3 wherein the openings formed in the first and second adhesive layers comprises:
   a first set of openings formed in the first adhesive layer; and
   a second set of openings formed in the second adhesive layer;
   wherein the first adhesive layer covers the second set of openings and the second adhesive layer covers the first set of openings to prevent direct access to the first sensing element.

7. A circuit element package in accordance with claim 3 wherein the plurality of openings are formed in a size that allows gas to flow through the plurality of openings but prevents other elements to penetrate the die attach membrane.

8. A circuit element package in accordance with claim 1 wherein the circuit element die has a double sided sensor port, the first sensor port positioned over the access hole, a second sensor port positioned on a surface of the circuit element die opposite of the first sensing element, the second sensor port being exposed.

9. A circuit element package in accordance with claim 8 further comprising a protective coating formed over the second sensor port.

10. A circuit element package comprising:
    a substrate having a die pad, and an access hole formed through the die pad;
    a circuit element die attached to the die pad wherein a first sensor port of the circuit element die is positioned over the access hole;
    a die attach membrane formed over the access hole for coupling the circuit element die to the substrate, the die attach membrane allowing the circuit element die to sense ambient while protecting the circuit element die from environmental damage, wherein the portion of the die attach membrane for attaching the circuit element to the die pad allows air to flow through the die attach membrane to the circuit element;
    sidewalls formed on the substrate forming a cavity around the circuit element die; and
    a lid positioned over the cavity and coupled to the sidewalls for protect the circuit element die from environmental damage.

11. A circuit element package in accordance with claim 10 further comprising:
    a semiconductor die;
    an adhesive layer for coupling the semiconductor die to the substrate; and
    an encapsulant for covering portions of the semiconductor die.

12. A circuit element package in accordance with claim 10 wherein the die attach membrane comprises:
    a porous membrane layer;
    a first adhesive layer formed on a first surface of the porous membrane layer;
    a second adhesive layer formed on a second surface of the porous membrane layer; and
    a plurality of openings formed in the first and second adhesive layers for allowing air to flow through the die attach membrane.

13. A circuit element package in accordance with claim 12 wherein the porous membrane layer is made from Poly-Tetra-Fluoro-Ethylene (PTFE).

14. A circuit element package in accordance with claim 12 wherein the plurality of openings formed in the first and second adhesive layers are arranged in the first and second adhesive layers to prevent direct access to the first sensing element.

15. A circuit element package in accordance with claim 10 wherein the circuit element die has a double sided sensor port, the first sensor port positioned over the access hole, a second sensor port positioned on a surface of the circuit element die opposite of the first sensor port, the second sensing element being exposed.

16. A circuit element package in accordance with claim 10 further comprising a protective coating formed over the second sensor port.

17. A circuit element package in accordance with claim 10 further comprising a plurality of openings formed on the lid.

18. A circuit element package comprising:
    a substrate having a die pad, and an access hole formed through the die pad and substrate;
    a circuit element die attached to the die pad and having a sensor port positioned over the access hole;
    means formed over the access hole for attaching the circuit element die to the die pad and for allowing the circuit element die to sense ambient while protecting the circuit element die from environmental damage, wherein the portion of the means for attaching the circuit element to the die pad allows air to flow through the means to the circuit element; and
    an encapsulant for covering portions of the circuit element die.

19. A circuit element package in accordance with claim 18 further comprising:
   a semiconductor die; and
   means for coupling the semiconductor die to the substrate.

20. A circuit element package in accordance with claim 18 wherein the circuit element die has a double sided sensor port, the first sensor port positioned over the access hole, a second sensor port positioned on a surface of the circuit element die opposite of the first sensing element, the second sensor port being exposed.

* * * * *